(12) United States Patent
Suzuki et al.

(10) Patent No.: US 7,859,286 B2
(45) Date of Patent: Dec. 28, 2010

(54) ELECTRONIC DEVICE TEST SYSTEM

(75) Inventors: Katsuhiko Suzuki, Tokyo (JP); Shigeki Kaneko, Tokyo (JP); Hiroki Ikeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 121 days.

(21) Appl. No.: 11/911,202

(22) PCT Filed: Jul. 13, 2006

(86) PCT No.: PCT/JP2006/313962

§ 371 (c)(1),
(2), (4) Date: Jan. 11, 2008

(87) PCT Pub. No.: WO2007/007835

PCT Pub. Date: Jan. 18, 2007

(65) Prior Publication Data

US 2009/0058439 A1    Mar. 5, 2009

(30) Foreign Application Priority Data

Jul. 13, 2005    (WO) ................. PCT/JP2005/012947

(51) Int. Cl.
*G01R 31/26*    (2006.01)

(52) U.S. Cl. ..................................... 324/765; 324/158.1
(58) Field of Classification Search ......... 324/754–765, 324/158.1; 209/573
See application file for complete search history.

(56) References Cited

FOREIGN PATENT DOCUMENTS

| JP | 2001-033514 | 2/2001 |
| JP | 2002-207062 | 7/2002 |

OTHER PUBLICATIONS

"Multi-Size Chip Alignment Fixture"; IBM Technical Disclosure Bulletin; vol. 37; No. 5; May 1, 1994; pp. 309-310.*
English language Abstract of JP 2002-207062.
English language Abstract of JP 2001-033514.

* cited by examiner

*Primary Examiner*—Minh N Tang
(74) *Attorney, Agent, or Firm*—Greenblum & Bernstein, P.L.C.

(57) ABSTRACT

When the number of DUTs carried on a loader buffer and scheduled to be held by contact arms at the next test is less than N, a DUT at a contact arm corresponding to a missing position at the loader buffer among the N number of DUTs being held for execution of a current test is held as it is without being ejected. While holding this DUT, the DUTs carried at the loader buffer for execution of the next test are picked up and the test is executed in that state.

6 Claims, 6 Drawing Sheets

(A)

(B)

ELECTRONIC DEVICE TEST SYSTEM

BACKGROUND OF THE INVENTION

1. Field of the Invention

The present invention relates to an electronic device test system for testing semiconductor integrated circuit chips or other various types of devices under tests (hereinafter referred to representatively as "DUTs").

2. Description of the Related Art

In an electronic device test system referred to as a "handler", a large number of DUTs carried on a customer tray are conveyed to the inside of the handler. There, each DUT is picked up by a contact arm and brought into electrical contact with a contact part of a test head. The tester inputs a test pattern to the DUT for operation and examines the response pattern. Further, when finishing this test, each DUT is ejected from the contact part of the test head and reloaded on a tray in accordance with the test results so as to thereby classify it into a good device or defective device or high speed, medium speed, or low speed device.

Among these handlers, as a handler used for logic type ICs with a relatively short test time, for example, there is the one disclosed in Japanese Patent Publication (A) No. 2001-33514. This type of handler is a handler of a type which picks up two DUT's by a contact arm and simultaneously pushes them against contact parts. For a high temperature test, a heat plate is used to heat the DUTs and a heater is built into the contact arm to supply heat energy to the picked up DUTs for the test.

In this handler, to raise the test efficiency, it may be considered to simultaneously measure four, eight, or 16 DUTs.

However, for example, if simultaneously picking up four DUTs and simultaneously pushing these against contact parts for testing, there were the following problems.

First, when loading a handler with a lot unit of DUTs, the general practice has been to finish the lot, then load the next lot of DUTs, but if the number of DUTs in a lot is not a whole multiple of four, the last group of DUTs of the lot become one to three DUTs. For this reason, at the last test, some of the pickup devices of the contact arm will push against the contact parts in a state with no DUTs. Further, when a customer tray is emptied of DUTs, the same situation occurs as with the end of a lot, so "the end of a lot" includes the case where a tray is emptied of DUTs.

Further, the DUTs are physically pushed against the contact parts of the test head for contact. The resultant wear makes it necessary to perform maintenance on some of the four contact parts in some cases. In such cases, the contact parts requiring maintenance are turned off (so no test patterns are sent from the tester) and only the usable contact parts are used for line operation.

Further, the pretest DUTs are moved by a three-dimensional pick-and-place system from a customer tray to a heat plate and are further moved by another three-dimensional pick-and-place system from the heat plate to a buffer stage. The DUTs of this buffer stage art picked up by a contact arm and pushed against the contact parts. Pickup failure of DUTs or other trouble before being picked up by a contact arm sometimes results in four DUTs not being properly held.

In each case, the DUTs are pushed against the contact parts in a state with some missing as compared with the regular simultaneous measurement of four DUTs, so the balance of the pushing pressures is lost, the pushing surfaces become skewed, and the positional relationships between the terminals of the DUTs and the terminals of the corresponding sockets are easily thrown off—resulting in unnecessary stress to the terminals of the sockets or poor contact and a consequent drop in the test quality. The terminals of the sockets come into contact with DUTs hundreds of thousands of times during their service lives, so reliability of contact is required. Further, a heating source and/or cooling source provided at the contact arm is used to maintain the DUTs at a predetermined temperature, but if the pushing surface of the contact arm and the receiving surface of a DUT become skewed and the heat conduction with the DUT deteriorates, the test is liable not to be able to be conducted under the target temperature conditions.

SUMMARY OF THE INVENTION

An object of the present invention is to provide an electronic device test system able to maintain a balance of pushing pressures and stabilize the temperature applied even when some DUTs are missing when simultaneously testing a plurality of DUTs.

(1) To achieve this object, according to a first aspect of the present invention, there is provided an electronic device test system using M number (M is a natural number of 1 or more) of contact arms to hold N number of DUTs of a predetermined lot of a plurality of DUTs, simultaneously bringing these N number of DUTs into contact with N number of contact parts to which test patterns are input, classifying and ejecting the DUTs based on the response patterns, and repeating this until the predetermined lot ends, the electronic device test system having a loader buffer for temporarily carrying N number of DUTs to be held by the contact arms, a first detecting means for detecting the number and positions of the DUTs carried on the loader buffer, and a control means for issuing a command for making another DUT be held at a position of a contact arm corresponding to a missing position of a DUT detected by the first detecting means when the first detecting means judges that the number of the DUTs carried on the loader buffer is less than N.

Further, there is provided a method of testing electronic devices comprising a step of making M number (M is a natural number of 1 or more) of contact arms hold N number of DUTs of a predetermined lot of a plurality of DUTs, a step of bringing these N number of DUTs into simultaneous contact with the N number of contact parts to which test patterns are to be input, and a step of classifying and ejecting the DUTs based on response patterns of test patterns input to the DUTs, the steps being repeated until the predetermined lot is ended, the method of testing electronic devices further having a step of temporarily placing the N number of DUTs to be held by the contact arms on a loader buffer, a step of detecting the number and positions of the DUTs carried on the loader buffer, and a step of making another DUT be held at a position of a contact arm corresponding to a missing position of a DUT when the detection step judges that the number of DUTs carried on the loader buffer is less than N.

In the present invention, when the M number of contact arms hold N number of DUTs and make these N number of DUTs simultaneously contact the N number of contact parts, if there are not N number of DUTs to be held by the contact arms at the loader buffer, the missing number and positions are detected and DUTs are made to be held there. Due to this, the M number of contact arms may be made to simultaneously contact the N number of contact parts in a state with N number of DUTs held at all times, so the balance of the pushing pressures can be maintained and the applied temperature can be stabilized.

In the invention, the specific means for making a contact arm hold another DUT at a missing position is not particularly limited, but it is preferable to hold as it without ejection a device of the position of a contact arm corresponding to a missing position at the loader buffer among the N number of DUTs held for a current test and to use this DUT for the next test.

The contact arm already holds a DUT, so by utilizing the DUT as a filler device, no extra operation is required, the control method can be simplified, and the operation time can be shortened.

At this time, preferably that DUT is not tested by the current test step, but is tested by the next test step. If a single DUT is tested a plurality of times, the total number of DUTs and the total number of tests will not match and test management will become complicated. Further, compared with the method of testing the DUT at the current test step and not testing it at the next test step, the method of testing it near the ejection step gives more reliable test results.

Further, in the invention, when there is a loader part storing a plurality of trays carrying a plurality of DUTs before the loader buffer, when it is judged that the number of devices present at a tray of the loader part is less than N, it is preferable to hold these less than N number of DUTs as they are, stand by for a while, switch to the next tray, and load DUTs for the missing positions.

By doing this, the loader buffer in principle carries N number of DUTs and the state of missing DUTs at the abovementioned loader buffer can be reduced to a minimum.

Note that in the invention, when testing the DUTs at a high temperature, it is possible to provide a heat plate for carrying the DUTs and supplying them with heat energy before the loader buffer.

(2) To achieve the above object, according to a second aspect of the present invention, there is provided an electronic device test system using M number (M is a natural number of 1 or more) of contact arms to hold N number of DUTs of a predetermined lot of a plurality of DUTs, simultaneously bringing these N number of DUTs into contact with N number of contact parts to which test patterns are input, classifying and ejecting the DUTs based on the response patterns, and repeating this until the predetermined lot ends, the electronic device test system having a third detecting means for detecting operating states of the N number of contact parts, a dummy storage unit for carrying dummy devices of the same shape as the DUTs, and a control means for issuing a command for making a dummy device carried at the dummy storage unit be held at a position of a contact arm corresponding to a contact part in an OFF state when the third detecting means judges that any of the contact parts is in an OFF state.

Further, there is provided a method of testing electronic devices comprising a step of making M number (M is a natural number of 1 or more) of contact arms hold N number of DUTs of a predetermined lot of a plurality of DUTs, a step of bringing these N number of DUTs into simultaneous contact with the N number of contact parts to which test patterns are to be input, and a step of classifying and ejecting the DUTs based on response patterns of test patterns input to the DUTs, the steps being repeated until the predetermined lot is ended, the method of testing electronic devices further having a step of detecting operating states of the N number of contact parts, a step of carrying dummy devices of the same shape as the DUTs on a dummy storage unit, and a step of making a dummy device carried at the dummy storage unit be held at a position of a contact arm corresponding to a contact part in an OFF state when the detecting step judges that any of the contact parts is in an OFF state.

In the present invention, when the M number of contact arms hold N number of DUTs and make these N number of DUTs simultaneously contact the N number of contact parts, if any of the N number of contact parts is in an OFF state (state with input of test pattern suspended) due to maintenance or other causes, the number and positions of those parts are detected and dummy devices of the same shape as the DUTs are made to be held there. Due to this, it is possible to make the M number of contact arms constantly simultaneously contact the N number of contact parts in a state with N number of DUTs held, so the balance of pushing pressures can be maintained and the applied temperature can be stabilized. Further, while a contact part is in the OFF state, it is sufficient to have it continuously hold a dummy device, so no other extra operation is required and the work time can be shortened.

(3) To achieve the above object, according to a third aspect of the present invention, there is provided an electronic device test system using N number (N is a natural number of 1 or more) of contact arms to hold M number of DUTs of a predetermined lot of a plurality of DUTs, simultaneously bringing these N number of DUTs into contact with N number of contact parts to which test patterns are input, classifying and ejecting the DUTs based on the response patterns, and repeating this until the predetermined lot ends, the electronic device test system having a fourth detecting means for detecting a total number of devices of a lot, a dummy storage unit for carrying dummy devices of the same shape as the DUTs, and a control means for issuing a command to make a dummy device carried at the dummy storage unit be held at a missing position of a contact arm when the fourth detecting means judges that the total number of devices of the lot is less than N.

Further, there is provided a method of testing electronic devices comprising a step of making M number (N is a natural number of 1 or more) of contact arms hold N number of DUTs of a predetermined lot of a plurality of DUTs, a step of bringing these N number of DUTs into simultaneous contact with the N number of contact parts to which test patterns are to be input, and a step of classifying and ejecting the DUTs based on response patterns of test patterns input to the DUTs, the steps being repeated until the predetermined lot is ended, the method of testing electronic devices further having a step of detecting a total number of devices of a lot, a step of placing dummy devices of the same shape as the DUTs on a dummy storage unit, and a step of making a dummy device carried on the dummy storage unit be held at a missing position of a contact arm when the detecting step judges that the total number of devices of the lot is less than N.

In the present invention, when the M number of contact arms hold N number of DUTs and make these N number of DUTs simultaneously contact the N number of contact parts, if the total number of devices of the lot of the DUTs is a small number of less than N, the number and positions of the DUTs at the loader buffer are detected and dummy devices of the same shape as the DUTs are made to be held at the missing positions of the electronic devices. Due to this, it is possible to make the M number of contact arms constantly simultaneously contact the N number of contact parts in a state with N number of DUTs held, so the balance of pushing pressures can be maintained and the applied temperature can be stabilized.

In the second and third aspects of the invention, the dummy storage unit can be utilized to carry a DUT for which retesting is required and any retesting can be performed by a different contact part.

When the cause of the retesting is a defect of the contact part, this operation can be used to find the defect in the contact part. Further, when the result of retesting by another contact part is other than required retesting, it can be judged that the result was due to the state of the electronic device.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, embodiments of the present invention will be explained based on the drawings.

Figure 1:
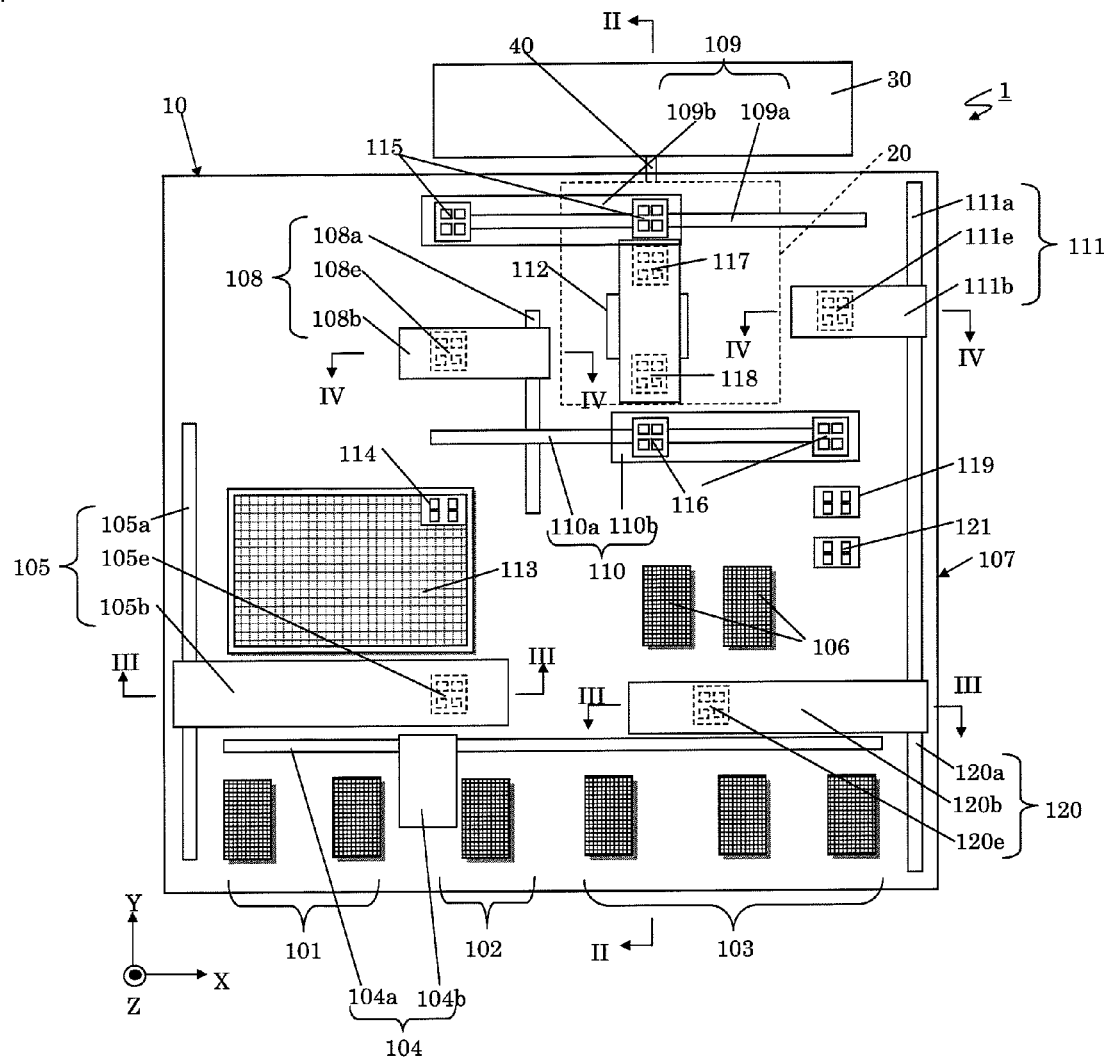
FIG. 1 is a plan view showing an electronic device test system of an embodiment of the present invention.

The electronic device test system 1 of the present embodiment, as shown in FIG. 1, is comprised of a handler 10, a test head 20, and a tester 30. The test head 20 and the tester 30 are connected by a cable 40.

The handler 10 is provided with a feed tray stocker 101 for being loaded with a stack of trays carrying pretest DUTs, an empty tray stocker 102 for stacking trays emptied at the feed tray stocker 101, and a classification tray stocker 103 in which trays for classifying the tested DUTs are stacked. Further, a tray conveyor system 104 for conveying trays emptied at the feed tray stocker 101 to the empty tray stocker 102 or conveying empty trays of the empty tray stocker 102 to the classification tray stocker 103 is provided to be able to move along the tray stockers 102, 103, and 104. This tray conveyor system 104 is comprised of a rail 104a and a conveyor arm 104b provided with a pickup device for picking up a tray. Further, while not illustrated, an elevator system for moving the trays stacked at the tray stockers 101, 102, and 103 in the vertical direction and setting them at the pickup position of the tray conveyor system 104 or the pickup position of the later explained XYZ conveyor system 105 is provided. Note that the trays carried at the tray station 106 are also classification trays, but these classification trays are placed there and removed by the operator and are used for example for classification of DUTs of extremely rare categories. Therefore, the handler of this example can classify DUTs into five types of categories.

Figure 2:
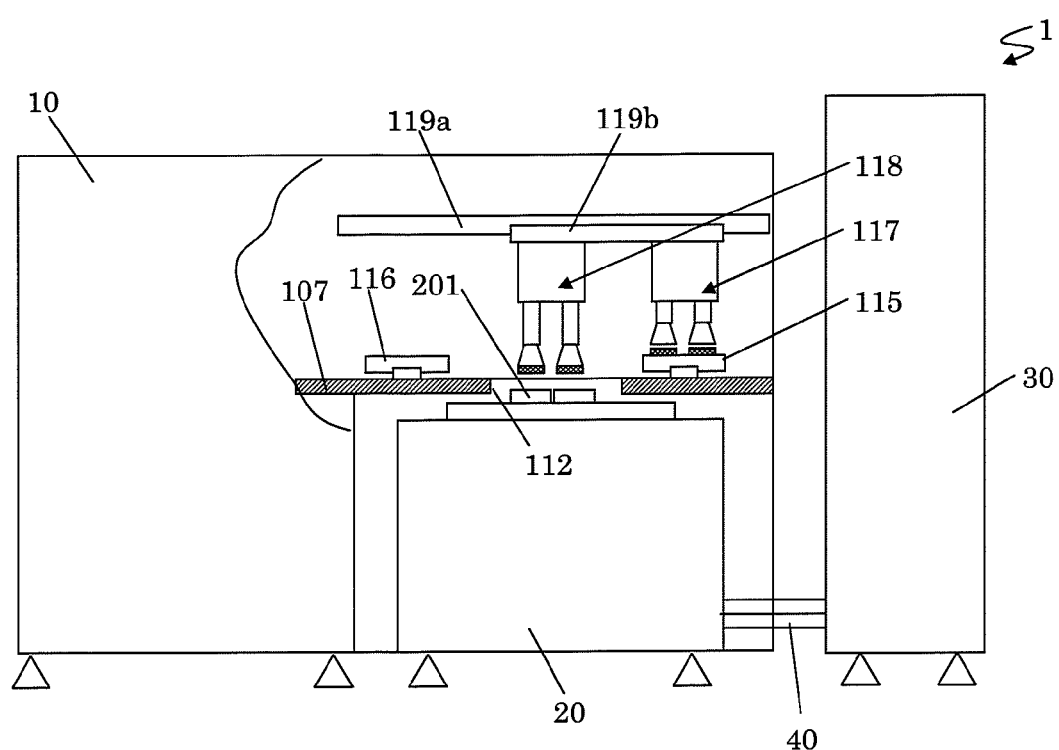
FIG. 2 is a cross-sectional view along the line II-II of FIG. 1.

The handler 10 is provided with a frame board 107. This frame board 107 is provided on it with conveyor systems 105, 108, 109, 110, 111, and 120 for the DUTs. Further, the frame board 107 is formed with an opening part 112. As shown in FIG. 2, contact parts 201 of a test head 20 arranged at the back side of the handler 10 are designed to approach the DUTs through the opening part 112.

The conveyor systems 105, 108, 109, 110, and 111 of the DUTs provided on the frame board 107 will be explained next.

First, an XYZ conveyor system 105 is provided between the two feed tray stockers 101 and heat plate 113 (including the loader buffer 114) for conveying the pretest DUTs.

Figure 3:
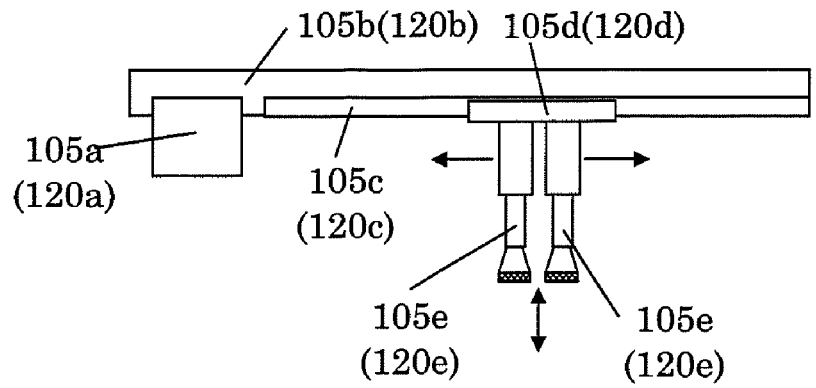
FIG. 3 is a cross-sectional view along the line III-III of FIG. 1.

This XYZ conveyor system 105 has a Y-axis rail 105a provided along a Y-axial direction, a first base 105b provided to be able to move along this Y-axis rail 105a and extending in the X-axial direction, an X-axis rail 105c provided along this first base 105b, a second base 105d provided to be able to move along this X-axis rail 105c, and pairs of pickup devices 105e provided to be able to move slightly along this second base 105d in the X-axial direction. Note that FIG. 1 shows the Y-axis rail 105a and first base 105b by solid lines and shows the pairs of pickup devices 105e by dotted lines. Details of this structure are shown in FIG. 3.

That is, the pickup devices 105e move along the Y-axis rail 105a and X-axis rail 105c in the range from a tray of the feed tray stocker 101 to the heat plate 113 and loader buffer 114. Further, they are designed to be able to be moved by a not shown Z-axis actuator in the Z-axial direction, that is, the vertical direction as well.

In this example, there are a total of four pickup devices 105e able to pick up a total of four DUTs. These pick up, convey, and release the DUTs. FIG. 3 is a view cut away along the X-axial direction and seen along the Y-axial direction. The pickup devices positioned at the rear are hidden by the front pickup devices.

Among these four pickup devices 105e, the pitch of each two pickup devices 105e arranged in the Y-axial direction is set to be equal to the pitch of the DUTs in the state carried on the feed tray. On the other hand, the pairs of these pickup devices are designed to be able to move slightly in the X-axial direction as shown in FIG. 3. This is because the pitch of the DUTs at the contact parts 201 becomes larger than the pitch of the DUTs in the state carried on the feed tray due to the structure of the sockets. This is therefore a mechanism for enlarging the pitches of the four DUTs in the middle of conveyance of the four DUTs from the feed tray stocker 101 to the contact parts 201. The XYZ conveyor system 105 enlarges the pitch of the DUTs in only the Y-axial direction and moves them to the heat plate 113 or loader buffer 114.

Figure 4:
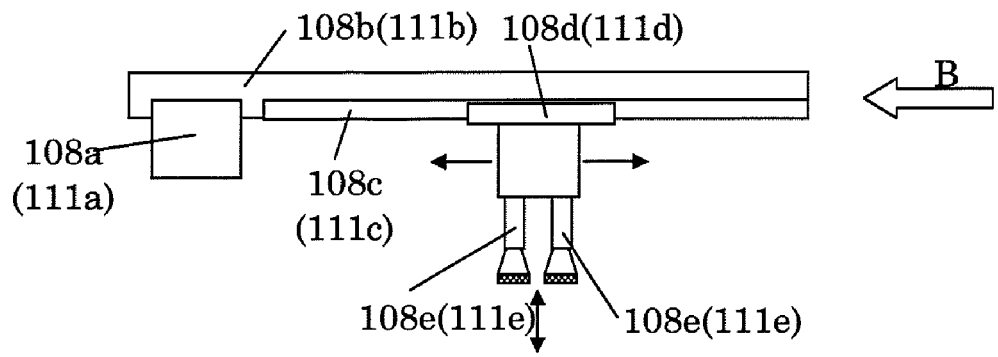
FIG. 4 is a cross-sectional view along the line IV-IV of FIG. 1.
Figure 4:
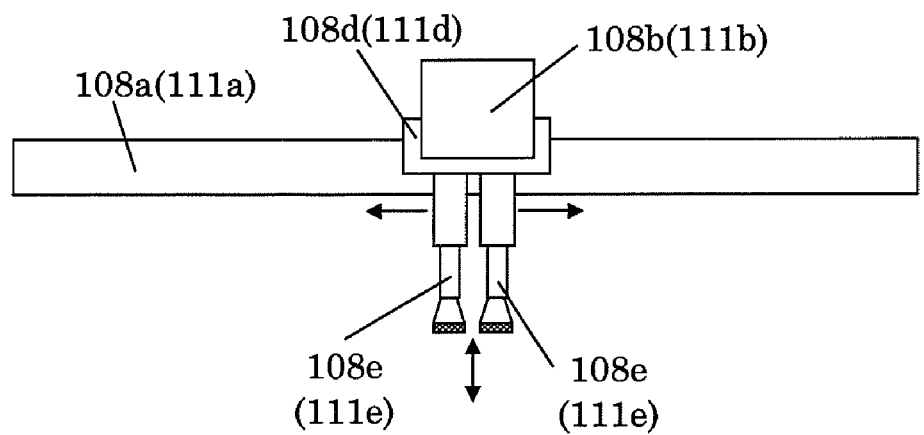

The XYZ conveyor system 108 has substantially the same structure as the above-mentioned XYZ conveyor system 105, that is, has a Y-axis rail 108a provided along a Y-axial direction, a first base 108b provided to be able to move along this Y-axis rail 108a and extending in the X-axial direction, an X-axis rail 108c provided along this first base 108b, a second base 108d provided to be able to move along this X-axis rail 108c, and pairs of pickup devices 108e provided to be able to move slightly along this second base 108d in the Y-axial direction. Note that FIG. 1 shows the Y-axis rail 108a and first base 108b by solid lines and shows the pairs of pickup devices 108e by dotted lines. Details of this structure are shown in FIGS. 4A and 4B. FIG. 4B is a view along the arrow B of FIG. 4A.

Further, the pickup devices 105e move along the Y-axis rail 109a and X-axis rail 108c in the range from a tray of the loader buffer 114 to the two buffer stages 115, 116. Further, they are designed to be able to be moved by a not shown Z-axis actuator in the Z-axial direction, that is, the vertical direction as well.

Further, while the XYZ conveyor system 105 makes the pitch of the DUTs larger in only the Y-axial direction, as shown in FIG. 4B, the XYZ conveyor system 108 makes the pitch of the DUTs larger in the X-axial direction.

The XYZ conveyor system 108 picks up four DUTs carried on the loader buffer 114 and alternately conveys them to and releases them at two buffer stages 115, 116 while increasing the pitch in the X-axial direction.

The buffer stages 115 are provided at a conveyor system 109 comprised of a rail 109a extending in the X-axial direction and a base 109b moving on this rail 109a back and forth in only the X-axial direction. Specifically, the buffer stages 115 are provided at the two ends of the base 109b in the X-axial direction and are comprised of indentations having inclined parts enabling IC positioning. Further, similarly, the buffer stages 116 are provided at a conveyor system 110 comprised of a rail 110a extending in the X-axial direction and a base 110b moving on this rail 110a back and forth in only the X-axial direction. Specifically, the buffer stages 116 are provided at two ends of the base 110b in the X-axial direction are formed and are comprised of indentations having inclined parts enabling IC positioning.

Further, among the buffer stages 115, the left side buffer stage 115 of FIG. 1 receives the DUTs conveyed by the XYZ conveyor system 108 as illustrated, while the right side buffer stage 115 receives the four DUTs picked up by the contact arms 117 and finished being tested. Further, when the base 109b moves to the right side in the figure, the left side buffer stage 115 approaches the contact arms 117 and the right side buffer stage 115 approaches the pickup devices of the XYZ conveyor system 111, so the contact arms 117 pick up and test the four pretest DUTs carried on the left side buffer stage 115 and simultaneously the XYZ conveyor system 111 picks up and conveys to the eject stage 119 the four tested DUTs carried on the right side buffer stage 115.

Similarly, among the buffer stages 116, when the base 110b moves from the position shown in FIG. 1 to the left side, the left side buffer stage 116 receives the DUTs conveyed by the XYZ conveyor system 108, while the right side buffer stage 116 receives the four DUTs picked up and finished being tested by the contact arms 118. Further, when the base 110b moves to the right side as illustrated, the left side buffer stage 116 approaches the contact arms 118 and the right side buffer stage 116 approaches the pickup devices of the XYZ conveyor system 111, so the contact arms 118 pick up and test the four pretest DUTs carried on the left side buffer stage 116 and simultaneously the XYZ conveyor system 111 picks up and conveys to the eject stage 119 the four tested DUTs carried on the right side buffer stage 116.

These buffer stages 115 and 116 alternately move back and forth.

As shown in FIG. 1 and FIG. 2, the contact arms 117 and 118 are provided so that contact parts 201 of the test head 20 face them through the opening part 112. The contact arms 117, 118, as shown in FIG. 2, are fixed at constant pitches to the base 119b moving back and forth along the rail 119a in the Y-axial direction and are able to move in the Z-axial direction when picking up and releasing DUTs. Further, as shown in FIG. 2, when the contact arms 117 face a buffer stage 115, the contact arms 118 face the contact parts 201. When the base 119b moves to the left side from the illustrated position, the contact arms 117 face the contact parts 201, and the contact arms 118 face a buffer stage 116.

The XYZ conveyor system 111 has substantially the same structure as the above-mentioned XYZ conveyor system 108, that is, has a Y-axis rail 111a provided along the Y-axial direction, a first base 111b provided to be able to move along this Y-axis rail 111a and extending in the X-axial direction, an X-axis rail 111c provided along this first base 111b, a second base 111d provided to be able to move along this X-axis rail 111c, and pairs of pickup devices 111e provided to be able to move slightly along this second base 111d in the Y-axial direction. Note that FIG. 1 shows the Y-axis rail 111a and first base 111b by solid lines, while shows the pairs of pickup devices 111e by dotted lines. Details of the structure are shown by parenthesized reference numerals in FIGS. 4A and 4B. FIG. 4B is a view along the arrow B of FIG. 4A.

Further, the pickup devices 111e are designed to be able to move in the range from the buffer stages 115, 116 to the eject stage 119 and the later explained dummy storage unit 121 along the Y-axis rail 111a and X-axis rail 111c and further by a not shown Z-axis actuator in the Z-axial direction, that is, the vertical direction.

Further, the XYZ conveyor system 111, as shown in FIG. 4B, reduces the pitch between DUTs in the Y-axial direction to match with the pitch on the tray. That is, the XYZ conveyor system 111 picks up four DUTs carried on the buffer stages 115, 116, reduces the pitch in the Y-axial direction, and conveys them to the eject stage 119 for release.

The XYZ conveyor system 120 has a Y-axis rail 120a provided along the Y-axial direction, a first base 120b provided to be able to move along this Y-axis rail 120a and extending in the X-axial direction, an X-axis rail 120c provided along this first base 120b, a second base 120d provided to be able to move along this X-axis rail 120c, and pairs of pickup devices 120e provided to be able to move slightly along this second base 120d in the X-axial direction. Note that FIG. 1 shows the Y-axis rail 120a and first base 120b by solid lines, while shows the pairs of pickup devices 120e by dotted lines. Details of the structure are shown by parenthesized reference numerals in FIG. 3.

Further, the pickup devices 120e are designed to move in the range from the eject stage 119 to the classification tray stocker 103 along the Y-axis rail 120a and X-axis rail 120c and further to be able to move by a not shown Z-axis actuator in the Z-axial direction, that is, the vertical direction.

Further, the XYZ conveyor system 120, as shown in FIG. 3, reduces the pitch between DUTs in the X-axial direction to match with the pitch on the tray. That is, the XYZ conveyor system 120 picks up four DUTs carried on the eject stage 119, reduces the pitch in the X-axial direction, and conveys them to one of the trays of the classification tray stocker 103 for release.

Note that the eject stage 119 is provided next to it with a dummy storage unit 121 for storing dummy DUTs. It carries four dummy DUTs at the same pitch as the eject stage 119. A "dummy IC" is an object of at least the same outer shape as the DUTs and preferably has an equivalent heat capacity as well. As a dummy IC, it is also possible to use an IC judged to be defective, but in this case it is preferable that it be marked or colored so as to enable a worker to visually discern that it is a dummy IC.

Further, a heat plate 113 is provided at a position near the loader buffer 114. This heat plate 113 is for example a metal plate formed with a plurality of indentations into which DUTs are dropped. These indentations are supplied with pretest DUTs conveyed from the feed tray stocker 101.

The heat plate 113 is provided on its bottom surface with a heating element (heating system and/or cooling system) for applying a predetermined thermal stress to the DUTs. The DUTs are heated or cooled to a predetermined temperature by the heat from the heating element conducted through the heat plate 113, then are pushed against the contact parts 201 of the test head 20 through the loader buffer 114.

Note that when conducting a high temperature test, the XYZ conveyor system 105 places DUTs from the feed tray stocker 101 on the heat plate 113 at predetermined positions and picks up DUTs left previously standing there for a predetermined time and moves them to the loader buffer 114.

However, when conducting an ordinary temperature test, it may move them directly from the feed tray stocker 101 to the loader buffer 114.

Next, the normal operation will be explained.

The pretest DUTs carried on a tray of the feed tray stocker 101 of the handler 10 are picked up and held by the XYZ conveyor system 105 four at a time and conveyed to the IC holding indentations of the heat plate 113. At this time, they are placed on the heat plate 113 increased in pitch in the X-axial direction from the pitch on the tray.

Allowing the DUTs to stand here for exactly a predetermined time enables the DUTs to rise to a predetermined temperature. The XYZ conveyor system 105 conveying DUTs before being raised in temperature from a tray 101 of the feed tray stocker to the heat plate 113, releases the DUTs there, and simultaneously picks up and holds DUTs previously allowed to stand at the heat plate 113 and raised to the predetermined temperature and conveys them to the loader buffer 114.

The four DUTs carried on the loader buffer 114 are picked up and held by the pickup devices 108e of the XYZ conveyor system 108, increased in pitch in the Y-axial direction, and conveyed to and placed at one of the buffer stages 115, 116. The buffer stages 115, 116 are provided with preciser functions (positioning functions), so the positional relationships with the contact parts 201 are suitably adjusted there.

Note that when the XYZ conveyor system 108 conveys the four picked up and held DUTs to for example a buffer stage 115, the next four DUTs to be picked up and held are conveyed to a buffer stage 116.

The buffer stages 115 and 116 move alternately back and forth to the left and right in FIG. 1. When the XYZ conveyor system 108 places pretest DUTs on the left side buffer stage 115, simultaneously it places the tested DUTs picked up and held by the contact arms 117 to the right side buffer stage 115. Further, when the base 109b moves to the right side, the contact arms 117 pick up and hold the pretest DUTs carried on the left side buffer stage 115 and, simultaneously, the XYZ conveyor system 111 picks up and holds the tested DUTs carried on the right side buffer stage 115 and conveys them to the eject stage 119. The buffer stage 116 operates symmetrically with the above-mentioned buffer stage 115.

The contact arms 117 picking up and holding the pretest DUTs operate in the right-left direction shown in FIG. 2 synchronously with the other contact arms 118 picking up and holding the tested DUTs. When the contact arms 117 face the contact parts 201 of the test head 20, they descend in the Z-axial direction and push the DUTs against the contact parts 201. In this state, the tester 30 sends test patterns through the contact parts 201 to the DUTs and, based on the response patterns to them, output the judgments of quality of the DUTs, the performance rankings, and other test results.

The DUTs pushed against the contact parts 201 and finished being tested move to the right side shown in FIG. 2 while picked up and held by the contact arms 117 and are placed on the right side buffer stage 115. Next, this buffer stage 115 moves to the right side shown in FIG. 1. Here, the XYZ conveyor system 111 picks up and holds the tested DUTs carried on the right side buffer stage 115 and conveys them to the eject stage 119. At this time, the pitch in the Y-axial direction is made smaller to match the pitch on the trays.

The tester 30 outputs the test results to the handler 10, so that the control system (not shown) of the handler 10 recognizes the test results for the four DUTs placed on the eject stage 119. Receiving this, the XYZ conveyor system 120 classifies the four DUTs placed on the eject stage 119 on trays in accordance with the test results. The classification trays include the three classification trays stored in the classification tray stocker 103 and the two classification trays placed at the tray station 116, that is, a total of five classification trays. When for example almost all of the DUTs are of good quality rather than defective, the trays in the classification tray stocker 103 are made classification trays for good devices while one of the trays at the tray station 106 is made a classification tray for defective devices and the other tray is made a classification tray for retesting. Further, the good devices may be further subclassified by operation speed into high speed, medium speed, and low speed devices and the three shelves in the classification tray stocker 103 may all be made subclassification IC trays.

This completes the explanation of the main operation of the present embodiment. Next, the processing in the case where there are less than four DUTs picked up and held by the contact arms 117, 118 will be explained.

Processing of First Embodiment

Figure 5:
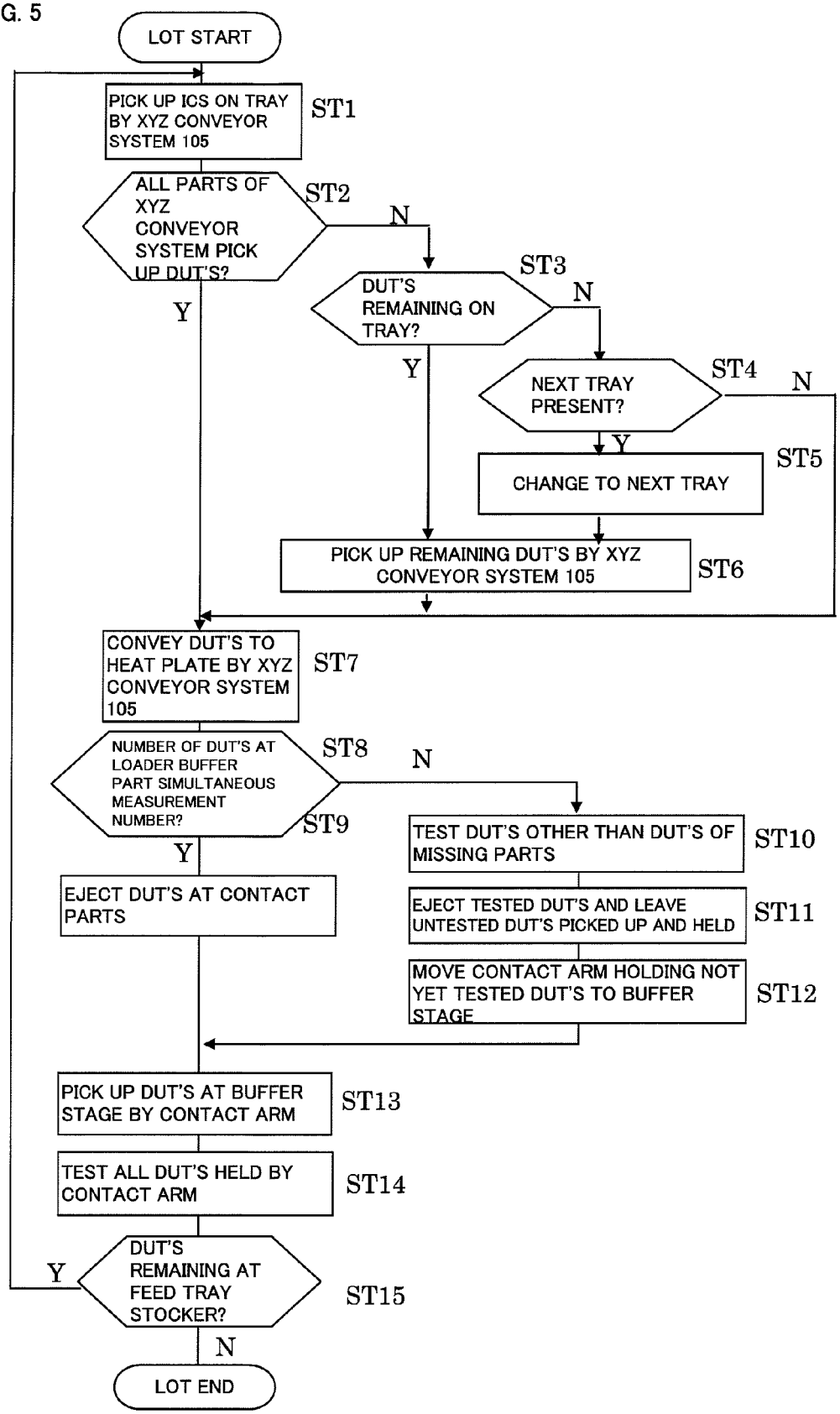
FIG. 5 is a flow chart of a control routine in an electronic device test system of an embodiment of the present invention.

FIG. 5 is a flow chart of the control routine in an electronic device test system of a first embodiment of the present invention.

In the present embodiment, when it is judged that there are less than four DUTs carried on the loader buffer 114, control for making other DUTs be held at the positions of the contact arms 117 and 118 corresponding to the missing positions of the DUTs is shifted to.

The case of there being less than four DUTs carried on the loader buffer 114 always arises at the last DUTs when the number of devices of a lot to be tested is not a whole multiple of four. Further, it may arise when DUTs are dropped in the middle of conveyance from the feed tray stocker 101 to the loader buffer 114.

Specifically, the number and positions of the DUTs carried on the loader buffer 114 are detected using vacuum pressure sensors provided at the pickup devices 105e of the XYZ conveyor system 105 when the XYZ conveyor system 105 conveys DUTs from the heat plate 113 to the loader buffer 114 or when it conveys them from the feed tray stocker 101 directly to the loader buffer 114. If there are no DUTs at any of the four pickup devices 105e at the time of conveyance, the vacuum pressure sensors will not indicate the appropriate negative pressure, so the number and positions of missing DUTs can be detected.

At step ST1 of FIG. 5, the XYZ conveyor system 105 is used to pick up and hold four DUTs from a tray in the feed tray stocker 101. At this time, at step ST2, it is judged whether the XYZ conveyor system 105 has actually picked up four DUTs. When the number of DUTs picked up and held at the XYZ conveyor system 105 is less the four, the routine proceeds to step ST3, where it is judged if there are any DUTs remaining at the tray located at the topmost level of the feed tray stocker 101. When there are DUTs remaining at another location of the tray at the topmost level, the DUTs are picked up from there (step ST6), while when there are not any DUTs remaining at the tray at the topmost level, it is confirmed that this is not the last tray (step ST4), the XYZ conveyor system 105 stands by at that position and the tray conveyor system 104 is used to move the tray at the topmost level to the empty tray stocker 102 (step ST5), then the DUTs carried on the tray of the next level of the feed tray stocker 101 are picked up (step ST6). Note that when the tray is the last tray of the lot, the routine proceeds to step ST7 as it is.

Other than at the end of a lot, four DUTs can be picked up at a time, so the XYZ conveyor system 105 picks up four DUTs, then conveys them to the heat plate 113 and releases them there (step ST7). After this, it picks up and holds four DUTs left standing on the heat plate 113 for a predetermined time and conveys them to the loader buffer 114. At the time of this operation, it is judged if the pickup devices 105e of the XYZ conveyor system 105 have picked up four DUTs. This is judged from the number and positions of the DUTs present at the loader buffer 114 (step ST8).

When at step ST8 the number of the DUTs conveyed to the loader buffer 114 is the number of simultaneous measurements, that is, four, the routine proceeds to step ST9, where the DUTs picked up and held by the contact arms 117 or 118, pushed against the contact parts 201, and finished being tested are ejected through the buffer stage 115 or 116 to the eject stage 119. When the number of the DUTs conveyed to the loader buffer 114 is less than the number of simultaneous measurements, that is, four, the routine proceeds to step ST10.

At step ST10, the DUTs corresponding to the positions of DUTs missing at the loader buffer 114 among the four DUTs currently picked up and held by the contact arms 117 or 118 are not sent test patterns by the tester 30. Only the other DUTs are tested. For example, when the DUT at the bottom left position of the loader buffer 114 shown in FIG. 1 is missing, the DUT picked up and held by the bottom left contact arm among the four contact arms 117 or 118 is not tested Note that in the handler 10 shown in FIG. 1, there are two of each of the buffer stages 115 and 116 and the two groups of contact arms 117 and 118. These operate alternately, so strictly speaking, when DUTs are missing at the loader buffer 114 at a certain time, the less than four DUTs of the loader buffer 114 where the DUTs are missing will be tested the next, next time after the DUTs currently being tested at the contact parts 201. Therefore, the processing of step ST10 of FIG. 5 is executed when the less than four DUTs are conveyed by the XYZ conveyor system 108 from the loader buffer 114 to the buffer stage 115 or 116.

Returning to step ST11 of FIG. 5, after the DUTs other than the DUTs of the missing parts finish being tested at step ST10, only the tested DUTs are conveyed to the buffer stage 115 or 116 and released and are ejected by the XYZ conveyor system 111 to the eject stage 119 and classified. As opposed to this, the not tested DUTs are kept in the state picked up and held by the contact arms 117 or 118 which are then moved to the buffer stage 115 or 116 to pick up and hold the next DUTs (step ST12).

At this time, the buffer stage 115 or 116 only carries less than four DUTs. The missing positions match with the positions of the DUTs picked up by the contact arms 117 or 118, so if picking up and holding DUTs of the buffer stage 115 or 116 (step ST13), the contact arms 117 or 118 end up with exactly four DUTs picked up and held.

The four DUTs picked up and held by the contact arms 117 or 118 in this state are pushed against the contact parts 201 and tested (step ST14). After this test ends, the four DUTs are ejected through the buffer stage 115 or 116 to the eject stage 119 and classified to the classification trays.

The above processing is repeated until there are no longer any DUTs carried on the trays of the feed tray stocker 101, that is, until the lot is finished (step ST15), but as explained above, if the number of devices in the lot is not a multiple of four, the finally remaining DUTs will always end up less than four so, as explained above, the test is executed through the processing of step ST10 to step ST12.

By doing this, the four contact arms 117 or 118 can be simultaneously brought into contact with the four contact parts 201 in a state holding four DUTs at all times, so the balance of pushing pressures can be maintained and, as a result, excessive pushing force can be prevented from being applied to the terminals of the sockets of the contact parts 201, so the reliabilities of the sockets can be maintained. Further, it is possible to prevent the trouble like in the past of the pushing surfaces becoming skewed and the positional relationships between the IC terminals of the DUTs and the terminals of the corresponding sockets becoming easily thrown off resulting in poor contact. Further, it is possible to prevent the trouble like in the past of the pushing surfaces of the contact arms and the receiving surfaces of the DUTs becoming skewed resulting in poor heat conduction with the DUTs. Therefore, a stable applied temperature can be maintained and the quality of the test can be maintained.

Processing of Second Embodiment

Figure 6:
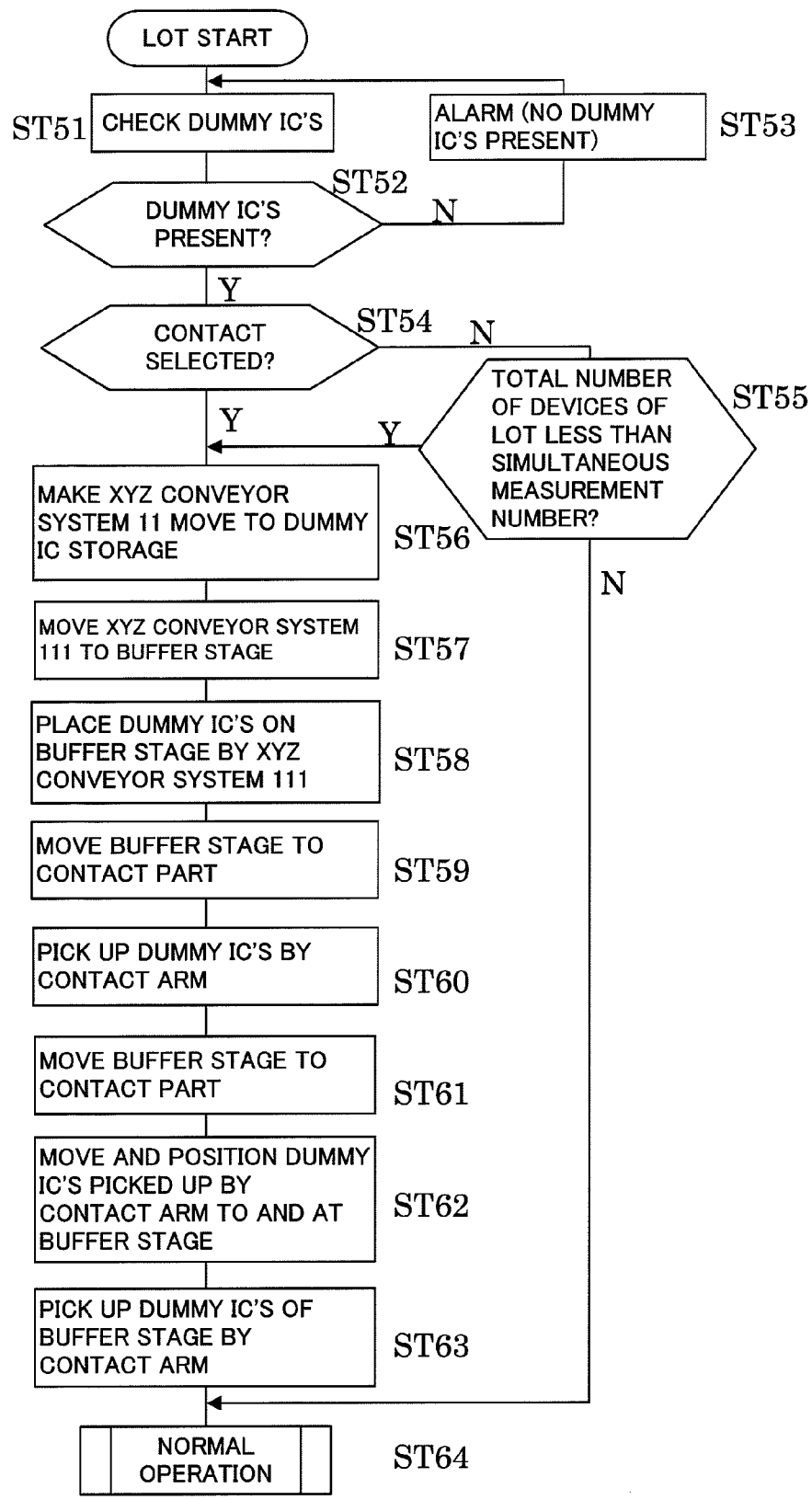
FIG. 6 is a flow chart of a control routine in an electronic device test system of another embodiment of the present invention.
Figure 7:
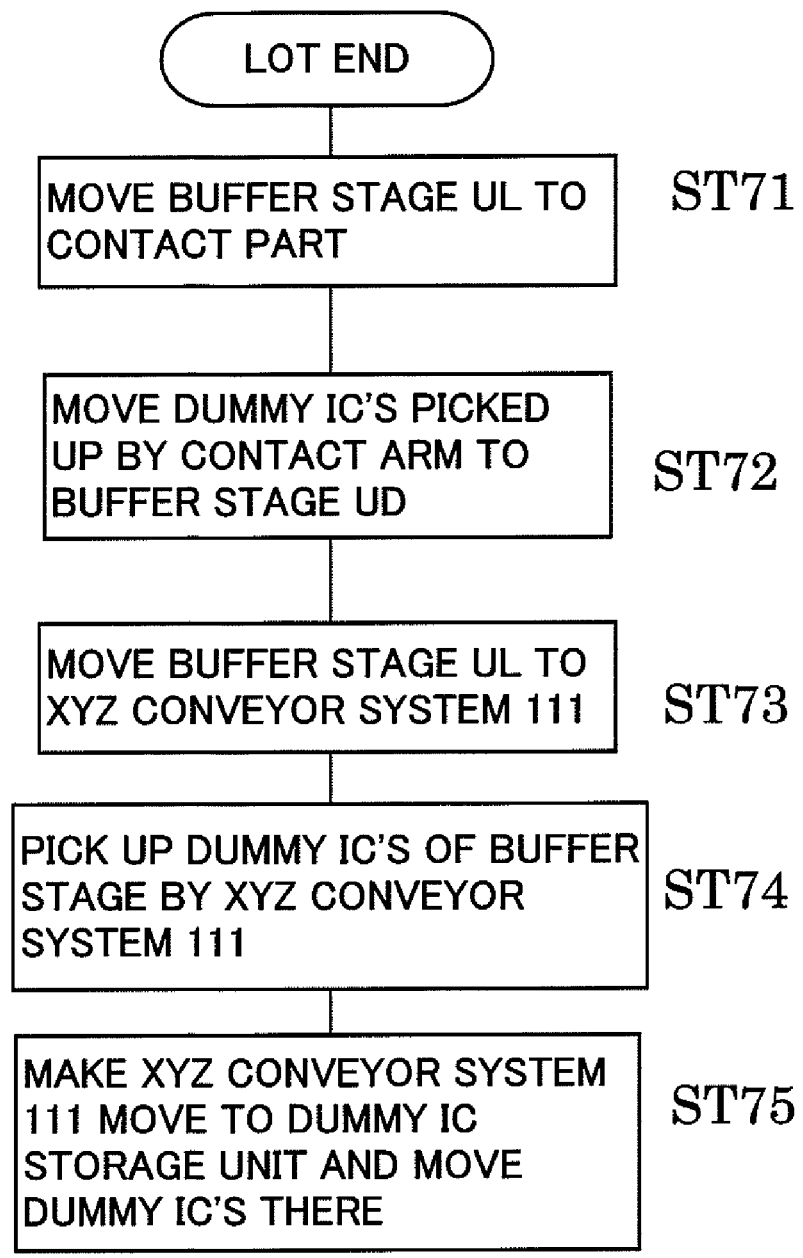
FIG. 7 is a flow chart of a control routine in an electronic device test system of another embodiment of the present invention.

FIG. 6 and FIG. 7 are flow charts of the control routine of an electronic device test system of a second embodiment of the present invention.

In the present embodiment, when it is judged that any of the contact parts 201 of the test head 20 are in an OFF state, control for making dummy devices carried on the dummy storage unit 121 be held at the positions of the contact arms 117, 118 corresponding to the contact parts 201 in the OFF state is shifted to. Further, when the total number of devices of a lot of DUTs to be tested does not reach the simultaneous measurement number four as well, control for making dummy devices carried on the dummy storage unit 121 be held at the positions of the contact arms 117, 118 missing DUTs is shifted to.

The contact parts 201 being in the OFF state is the case where there are sockets among the plurality of contact sockets provided at the contact parts 201 where contact terminals of the sockets have become defective and make normal testing difficult. Further, it is the case of defects accompanying problems on the tester 30 side. In such cases, until the contact parts are replaced or repaired, generally the test patterns stop being supplied to the specific contact parts 201 where testing has become difficult among the plurality of contact parts 201.

A contact part 201 being in the OFF state (also called the "contact select state") can be detected by the tester 30 executing a "contact test function" confirming for example that all IC pins are connected to the tester. Further, the total number of devices of a lot can be confirmed by the operator.

First, it is confirmed whether there are four dummy DUTs at the dummy storage unit 121 (steps ST51, ST52). When there are no dummy DUTs or not enough of them, an alarm is issued to alert the operator (step ST53).

When there are four dummy DUTs at the dummy storage unit 121, at step ST54 it is confirmed if any of the contact parts 201 are in the OFF state (if the contacts are selected). When all of the contact parts 201 are in the ON state, next it is confirmed if the total number of devices of the lot is less than four (step ST55).

If no contacts have been selected and the total number of devices of the lot is four or more, the routine proceeds to step ST64 where normal operation is performed, but when contacts have been selected or the total number of devices of the lot is less than four, the processing of the following explained steps ST56 to ST63 is executed, then normal operation is performed.

At step ST56, the XYZ conveyor system 111 is used to pick up dummy DUTs carried on the dummy storage unit 121. At this time, it picks up and holds dummy DUTs at positions corresponding to the contact select positions.

After picking up and holding the dummy DUTs, the XYZ conveyor system 11 moves the dummy DUTs to the unloader side of the buffer stage 115 or 116 (steps ST57, ST58), the unloader side of the buffer stage 115 or 116 carrying the dummys DUTs is moved to a position close to the contact parts 201 (step ST59), and the contact arms 117 or 118 pick up and hold the dummy DUTs (step ST60).

Next, the buffer stage 115 or 116 is moved in the opposite direction and the dummy DUTs are placed on the buffer stage loader side opposite to where the dummy DUTs were previously placed (step ST61, ST62). The buffer stage loader side has an IC positioning function (preciser function), so by having the contact arms 117 or 118 again pick up and hold the dummy DUTs, the contact arms 117 or 118 can pick up and hold the dummy DUTs in a suitable state.

After the above processing is ended, normal operation is shifted to, but pretest DUTs are not conveyed to the loader buffer 114 corresponding to the positions picking up the dummy DUTs.

By doing this, the four contact arms 117 or 118 can be made to contact the four contact parts 201 in the state constantly holding four DUTs, so the balance of the pushing pressures can be maintained and the applied temperature can be stabilized.

FIG. 7 is a flow chart showing the routine of finishing the testing for all DUTs, then returning the dummy DUTs to the dummy storage unit 121.

In this case, first, the unloader side of the buffer stage 115 or 116 is brought close to the contact parts 201 (step ST71), and the dummy DUTs held at the contact arms 117 or 118 are moved to the unloader side of the buffer stage 115 or 116 (step ST72).

Further, the buffer stage 115 or 116 is moved to the location of the XYZ conveyor system 111 (step ST73), this XYZ conveyor system 111 picks up and holds the dummy DUTs (step ST74), then moves further to the dummy storage unit 121 and returns the dummy DUTs (step ST75).

Note that the above explained embodiments were described for facilitating understanding of the present invention and were not described for limiting the present invention. Therefore, the elements disclosed in the above embodiments include all design changes and equivalents falling under the technical scope of the present invention.

The invention claimed is:

1. An electronic device test system using M number (M is a natural number of 1 or more) of contact arms to hold N number of DUTs of a predetermined lot of a plurality of DUTs, simultaneously bringing these N number of DUTs into contact with N number of contact parts to which test patterns are input, classifying and ejecting said DUTs based on the response patterns, and repeating this until said predetermined lot ends, said electronic device test system having a loader buffer for temporarily carrying N number of DUTs to be held by said contact arms, a first detector for detecting the number and positions of the DUTs carried on said loader buffer, and a controller for issuing a command for making another DUT be held at a position of a contact arm corresponding to a missing position of a DUT detected by said first detector when said first detector judges that the number of the DUTs carried on said loader buffer is less than N.

2. An electronic device test system as set forth in claim 1, wherein said controller, when the number of DUTs carried on said loader buffer scheduled to be held by said contact arms at a next test is less than N, issues a command for holding as is without ejection a DUT of a position of a contact arm corresponding to a missing position in said loader buffer among the N number of DUTs held for executing the current test and issues a command for holding the DUTs carried on said loader buffer for executing the next test while holding this DUT.

3. An electronic device test system as set forth in claim 2, wherein said controller issues a command for not testing by a current test a DUT of a position of a contact arm corresponding to a missing position at said loader buffer among the N number of DUTs being held for executing the current test, but testing it by a next test.

4. An electronic device test system as set forth in claim 1, further having a loader part for storing a plurality of trays on which a plurality of DUTs are carried, a mover for moving transferring N number of DUTs from a tray of said loader part to said loader buffer directly or indirectly, and a second detector for detecting the number of the DUTs remaining on a tray of said loader part;

said controller issues a command for holding less than N number of DUTs by said mover and issues a command for holding DUTs carried on a next tray at the missing positions of the mover when said second detector judges that the number of DUTs present on a tray of said loader part is less than N.

5. An electronic device test system as set forth in claim 4, wherein said system further has a heat plate for carrying DUTs before testing and supplying them with heat energy, and said mover transfers DUTs carried on a tray of said loader part to the heat plate and moves the DUTs carried on said heat plate to said loader buffer.

6. An electronic device test system as set forth in claim 1, wherein said N is $2^m$ (m is a natural number of 2 or more).

* * * * *